(12) United States Patent
Bracewell, Jr.

(10) Patent No.: US 10,905,126 B1
(45) Date of Patent: Feb. 2, 2021

(54) PATHOGENIC CONTROL COMPOSITIONS AND METHODS

(71) Applicant: Salveo, Inc., Georgetown, TX (US)

(72) Inventor: John Kenneth Bracewell, Jr., Georgetown, TX (US)

(73) Assignee: SALVEO, INC., Georgetown, TX (US)

( * ) Notice: Subject to any disclaimer, the term of this patent is extended or adjusted under 35 U.S.C. 154(b) by 0 days.

(21) Appl. No.: 16/937,480

(22) Filed: Jul. 23, 2020

Related U.S. Application Data

(63) Continuation of application No. PCT/US2019/049201, filed on Aug. 30, 2019.

(51) Int. Cl.
| | |
|---|---|
| *A01N 59/16* | (2006.01) |
| *A01N 43/16* | (2006.01) |
| *A01N 37/02* | (2006.01) |
| *A01G 25/02* | (2006.01) |
| *A01G 7/06* | (2006.01) |
| *A01C 1/06* | (2006.01) |
| *A01N 25/12* | (2006.01) |

(52) U.S. Cl.
CPC ............ *A01N 59/16* (2013.01); *A01C 1/06* (2013.01); *A01G 7/06* (2013.01); *A01G 25/023* (2013.01); *A01N 25/12* (2013.01); *A01N 37/02* (2013.01); *A01N 43/16* (2013.01)

(58) Field of Classification Search
CPC ...................................................... Y02E 30/40
USPC ............................................................ 504/101
See application file for complete search history.

(56) References Cited

U.S. PATENT DOCUMENTS

| | | | |
|---|---|---|---|
| 9,055,751 | B2 | 6/2015 | Averett |
| 10,117,435 | B2 | 11/2018 | Willette et al. |
| 2005/0079977 | A1 | 4/2005 | Choi |
| 2008/0241262 | A1 | 10/2008 | Lee |
| 2016/0030913 | A1 | 2/2016 | Kono |

OTHER PUBLICATIONS

Cheng et al. ,Journal of Alloys and Compounds 658 (2016) 684-688.*
International Search Report and Written Opinion dated Dec. 30, 2019 for PCT Application No. PCT/US2019/49201, filed Aug. 30, 2019.

* cited by examiner

*Primary Examiner* — Ali Soroush
*Assistant Examiner* — Courtney A Brown
(74) *Attorney, Agent, or Firm* — Knobbe, Martens, Olson & Bear LLP

(57) ABSTRACT

Provided herein are compositions, systems, and methods for treating plant, aquatic, and/or livestock pathogens. More specifically, the present disclosure relates to activated compositions having metal nanoparticles and/or one or more organic acids for the treatment of harmful plant, aquaculture, or livestock pathogens, and also relates to methods of making and using the compositions.

19 Claims, 5 Drawing Sheets

PATHOGENIC CONTROL COMPOSITIONS AND METHODS

INCORPORATION BY REFERENCE TO RELATED APPLICATIONS

This application is a continuation of PCT Application No. PCT/US2019/049201, filed Aug. 30, 2019, which is hereby incorporated by reference in its entirety.

FIELD

The present disclosure relates generally to the field of pathogenic control. In particular, the present disclosure relates to compositions and methods for controlling pathogens that have deleterious effects in agriculture, including in crop cultivation, aquaculture production, or in livestock production.

BACKGROUND

The global production of crops, aquatic farms, and livestock continues to increase. The increased global production in agriculture, including crops, aquaculture, and livestock is accompanied with increased plant, fish, crustaceans, and animal diseases due to harmful pathogens, such as fungi, bacteria, viruses, nematodes, or prions. In an effort to combat these pathogens, the application and distribution of pesticides has increased dramatically. Many pesticides include toxic chemicals that, while sometimes efficacious in controlling or mitigating pathogens, often result in harmful consequences to humans and to the environment, including to ground water, flora, and fauna. Further, many chemicals in use are persistent in the environment, further exacerbating the harmful consequences by mutating the fungi, bacteria, viruses, nematode, or prions.

Pesticides can reach surface water through runoff from treated plants and soil. Contamination of water by pesticides is widespread. The results of a comprehensive set of studies done by the U.S. Geological Survey (USGS) on major river basins across the country in the early to mid-90s yielded startling results. More than 90 percent of water and fish samples from all streams contained one, or more often, several pesticides (Kole et al; 2001).

SUMMARY

Described herein are compositions and methods for controlling pathogens that have a deleterious effect in global food production and plant health.

Some embodiments provided herein relate to activated compositions for treating a plant pathogen, or for treating an aquaculture pathogen. In some embodiments, the compositions include one or more metal nanoparticles and one or more organic acids. In some embodiments, the metal nanoparticles include gold, silver, magnesium, zinc, calcium, manganese, copper, palladium, nickel, platinum, titanium, cerium, iron, thallium, molybdenum, or an alloy, oxide, hydroxide, sulfide, nitrate, phosphate, fluoride, or chloride thereof. In some embodiments, the one or more organic acids comprise tannic acid, citric acid, tri-sodium citric acid, acetic acid, oxalic acid, tartaric acid, succinic acid, maleic acid, fumaric acid, gluconic acid, malic acid, ascorbic acid, benzoic acid, palmitic acid, alginic acid, polyglutamic acid, naphthalenesulfonic acid, methanesulfonic acid, p-toluenesulfonic acid, naphthalenedisulfonic acid, polygalacturonic acid, malonic acid, sulfosalicylic acid, glycolic acid, 2-hydroxy-3-naphthoate, pamoate, salicylic acid, stearic acid, phthalic acid, mandelic acid, or lactic acid, or combinations thereof. In some embodiments, the metal nanoparticles are present in an amount of less than 1% of the amount of the one or more organic acids. In some embodiments, the metal nanoparticles are present in the composition in an amount ranging from about 1 ppm to about 50,000 ppm. In some embodiments, the metal nanoparticles are monodispersed in the composition. In some embodiments, the monodispersion of the nanoparticles is achieved by sonication, emulsifier, surfactant, or other dispersion techniques. In some embodiments, the composition is activated by excitation with sonication, a laser, an electron gun, or thermal excitation. In some embodiments, the composition is formulated as a spray, a solution, a mist, or a powder. In some embodiments, the metal nanoparticles have a diameter ranging from about 1 nm to about 200 nm. In some embodiments, the metal nanoparticles are silver nanoparticles having a diameter ranging from about 1 nm to about 20 nm, wherein the one or more organic acids comprise tannic acid and citric acid or tri-sodium citrate, and wherein the composition is activated by excitation with sonication, a laser, an electron gun, or thermal excitation. In some embodiments, the activated composition has increased viscosity compared to a non-activated composition. In some embodiments, the activated composition remains stable for a period of at least 2 years.

Some embodiments provided herein relate to methods of making any of the activated compositions described herein. In some embodiments, the methods include generating metal nanoparticles, mixing the metal nanoparticles with one or more organic acids, and activating the composition by exciting the composition with energy using an energy source. In some embodiments, the energy source is sonication, a laser, an electron gun, or thermal excitation. In some embodiments, activating the composition comprises modulating the ionic, electronic, or quantum mechanics properties of the composition. In some embodiments, activating the composition comprises increasing electron ion activity in the composition, increases nanoparticle density, increases phonons, or increases particle ions.

Some embodiments provided herein relate to systems for making any of the compositions described herein. In some embodiments, the system includes one or more activation chambers and an energy source. In some embodiments, the energy source includes a sonicator, a laser, an electron gun, or a thermal energy source. In some embodiments, the system further includes one or more storage containers. In some embodiments, the system further includes one or more pumps. In some embodiments, the system further includes a computer processor, memory, circuit, sensor, monitor, real-time feedback loop, pump, actuator, switch, or any combination thereof. In some embodiments, the system is an automated system.

Some embodiments provided herein relate to methods of mitigating or controlling plant pathogens. In some embodiments, the method includes applying any one of the compositions described herein to a plant, a portion of a plant, or a plant component. In some embodiments, the plant component is a leaf, stem, trunk, stalk, flower, branch, fruit, root, shoot, bud, rhizome, or seed. In some embodiments, the plant pathogen is a mold, mold spore, fungus, mutated fungus, fungi spore, bacterium, mutated bacterium, virus, mutated virus, nematode, prion, or mutated prion. In some embodiments, the plant pathogen is *Fusarium oxysporum* f. sp. *Cubense*. In some embodiments, the plant pathogen is *Mycosphaerella fijiensis*. In some embodiments, applying the composition includes spraying, misting, crop-dusting, soaking the soil, or watering the plant. In some embodiments, applying the composition treats or prevents a plant disease.

Some embodiments provided herein relate to methods of mitigating or controlling aquaculture pathogens. In some embodiments, the method includes applying any one of the compositions described herein to an aquaculture. In some embodiments, the aquaculture includes aquatic life, including fish, crustaceans, or mollusks. In some embodiments, the aquatic life is a fish, a shrimp, or an oyster. In some embodiments, the aquaculture pathogen is a fungi, mutated fungi, bacterium, mutated bacterium, virus, or mutated virus. In some embodiments, applying the composition includes contacting the aquaculture water with the composition or providing the aquatic life with feed having the composition. In some embodiments, applying the composition treats or prevents a disease that affects the aquatic life.

Some embodiments provided herein relate to kits for treating a plant pathogen or for treating an aquaculture pathogen. In some embodiments, the kit includes any one of the compositions described herein and a dispensing apparatus capable of applying the composition to a plant or aquaculture. In some embodiments, the dispensing apparatus is a spray bottle, a sprayer, a nozzle, a high-pressure fluid soil injection system, or a drip line. In some embodiments, the compositions in the kit are concentrated compositions that are to be diluted prior to application. In some embodiments, the kit is a ready-to-use kit having compositions in the appropriate concentration that is ready for application.

Accordingly, some embodiments are provided herein as set forth in the following numbered alternatives:

1. An activated composition for treating a plant pathogen, the composition comprising: one or more metal nanoparticles; and one or more organic acids.

2. The composition of alternative 1, wherein the metal nanoparticles comprise gold, silver, magnesium, zinc, calcium, manganese, copper, palladium, nickel, platinum, titanium, cerium, iron, thallium, molybdenum, or an alloy, oxide, hydroxide, sulfide, nitrate, phosphate, fluoride, or chloride thereof.

3. The composition of any one of alternatives 1-2, wherein the one or more organic acids comprise tannic acid, citric acid, tri-sodium citric acid, acetic acid, oxalic acid, tartaric acid, succinic acid, maleic acid, fumaric acid, gluconic acid, malic acid, ascorbic acid, benzoic acid, palmitic acid, alginic acid, polyglutamic acid, naphthalenesulfonic acid, methanesulfonic acid, p-toluenesulfonic acid, naphthalenedisulfonic acid, polygalacturonic acid, malonic acid, sulfosalicylic acid, glycolic acid, 2-hydroxy-3-naphthoate, pamoate, salicylic acid, stearic acid, phthalic acid, mandelic acid, or lactic acid, or combinations thereof.

4. The composition of any one of alternatives 1-3, wherein the metal nanoparticles are present in an amount of less than 1% of the amount of the one or more organic acids.

5. The composition of any one of alternatives 1-4, wherein the metal nanoparticles are present in the composition in an amount ranging from about 1 ppm to about 10,000 ppm.

6. The composition of any one of alternatives 1-5, wherein the metal nanoparticles are monodispersed via sonication, emulsification, surfactant, or similar suspension techniques.

7. The composition of any one of alternatives 1-6, wherein the composition is activated by excitation with sonication, a laser, an electron gun, or thermal excitation.

8. The composition of any one of alternatives 1-7, wherein the composition is formulated as a spray, a solution, a mist, a seed coating, or a powder.

9. The composition of any one of alternatives 1-8, wherein the metal nanoparticles have a diameter ranging from about 1 nm to about 200 nm.

10. The composition of any one of alternatives 1-9, wherein the metal nanoparticles are silver nanoparticles present in an amount ranging from about 10 ppm to about 60 ppm, having a diameter ranging from about 1 nm to about 20 nm, and wherein the one or more organic acids comprise tannic acid present in an amount of about 30 mM, and citric acid or tri-sodium citrate present in an amount ranging from about 30 mM to about 300 mM.

11. The composition of alternative 10, wherein the composition is activated by excitation with sonication, a laser, an electron gun, or thermal excitation.

12. The composition of any one of alternatives 1-11, wherein the activated composition has increased viscosity compared to a non-activated composition.

13. The composition of any one of alternatives 1-12, wherein the activated composition remains stable for a period of at least 2 years.

14. A method of making an activated composition, the method comprising: generating metal nanoparticles; mixing the metal nanoparticles with one or more organic acids; and activating the composition chemical reduction or excitation of the composition with energy using an energy source.

15. The method of alternative 14, wherein the activated composition is the composition of any one of alternatives 1-13.

16. The method of any one of alternatives 14-15, wherein the energy source is sonication, a laser, an electron gun, or thermal excitation.

17. The method of any one of alternatives 14-16, wherein activating the composition comprises modulating the ionic, electronic, or quantum mechanics properties of the composition.

18. The method of any one of alternatives 14-17, wherein activating the composition comprises increasing electron ion activity in the composition, increases nanoparticle density, increases phonons, or increases a quantity of particle ions.

19. A system for making a composition, wherein the system comprises: one or more activation chambers; and an energy source.

20. The system of alternative 19, wherein the composition is the composition of any one of alternatives 1-13.

21. The system of any one of alternatives 19-20, wherein the energy source comprises a sonicator, a laser, an electron gun, or a thermal energy source.

22. The system of any one of alternatives 19-21, further comprising a storage container.

23. The system of any one of alternatives 19-22, further comprising one or more pumps.

24. The system of any one of alternatives 19-23, further comprising a computer processor, memory, circuit, sensor, monitor, real-time feedback loop, pump, actuator, switch, or any combination thereof.

25. The system of any one of alternatives 19-24, wherein the system is an automated system.

26. A method of mitigating or controlling a plant pathogen, the method comprising: applying a composition to a plant, a portion of a plant, or a plant component.

27. The method of alternative 26, wherein the composition is the composition of any one of alternatives 1-13.

28. The method of any one of alternatives 26-27, wherein the plant component is a leaf, stem, trunk, stalk, flower, branch, fruit, root, shoot, bud, rhizome, or seed.

29. The method of any one of alternatives 26-28, wherein the plant pathogen is a mold, mold spore, fungus, mutated fungus, fungi spore, bacterium, mutated bacterium, virus, mutated virus, nematode prion, or mutated prion.

30. The method of any one of alternatives 26-29, wherein the plant pathogen is *Fusarium oxysporum* f. sp. *Cubense*.

31. The method of any one of alternatives 26-29, wherein the plant pathogen is *Mycosphaerella fijiensis*.

32. The method of any one of alternatives 26-31, wherein applying the composition comprises drenching, spraying, misting, crop-dusting, soaking, seed-coating, or watering the plant, the portion of the plant, or the plant component.

33. The method of any one of alternatives 26-32, wherein applying the composition treats a plant disease.

34. A kit, comprising: the composition of any one of alternatives 1-13; and a dispensing apparatus capable of applying the composition to a plant.

35. The kit of alternative 34, wherein the dispensing apparatus is a spray bottle, a sprayer, a nozzle, or a drip line.

36. The kit of any one of alternatives 34-35, wherein the kit is a ready-to-use kit.

BRIEF DESCRIPTION OF THE DRAWINGS

The features disclosed herein are described below with reference to the drawings. The drawings are provided to illustrate embodiments of the inventions described herein and not to limit the scope thereof.

FIG. 2A depicts inhibition of germinate tube growth for conventional *M. fijiensis* (*M. fijiensis* that shows signs of mutation) with increasing concentrations of the composition. FIG. 2B depicts inhibition of germinate tube growth for wild type *M. fijiensis* with increasing concentrations of the composition. FIG. 2C depicts inhibition of colony development for *M. fijiensis* with increasing concentrations of the composition.

DETAILED DESCRIPTION

Figure 1:
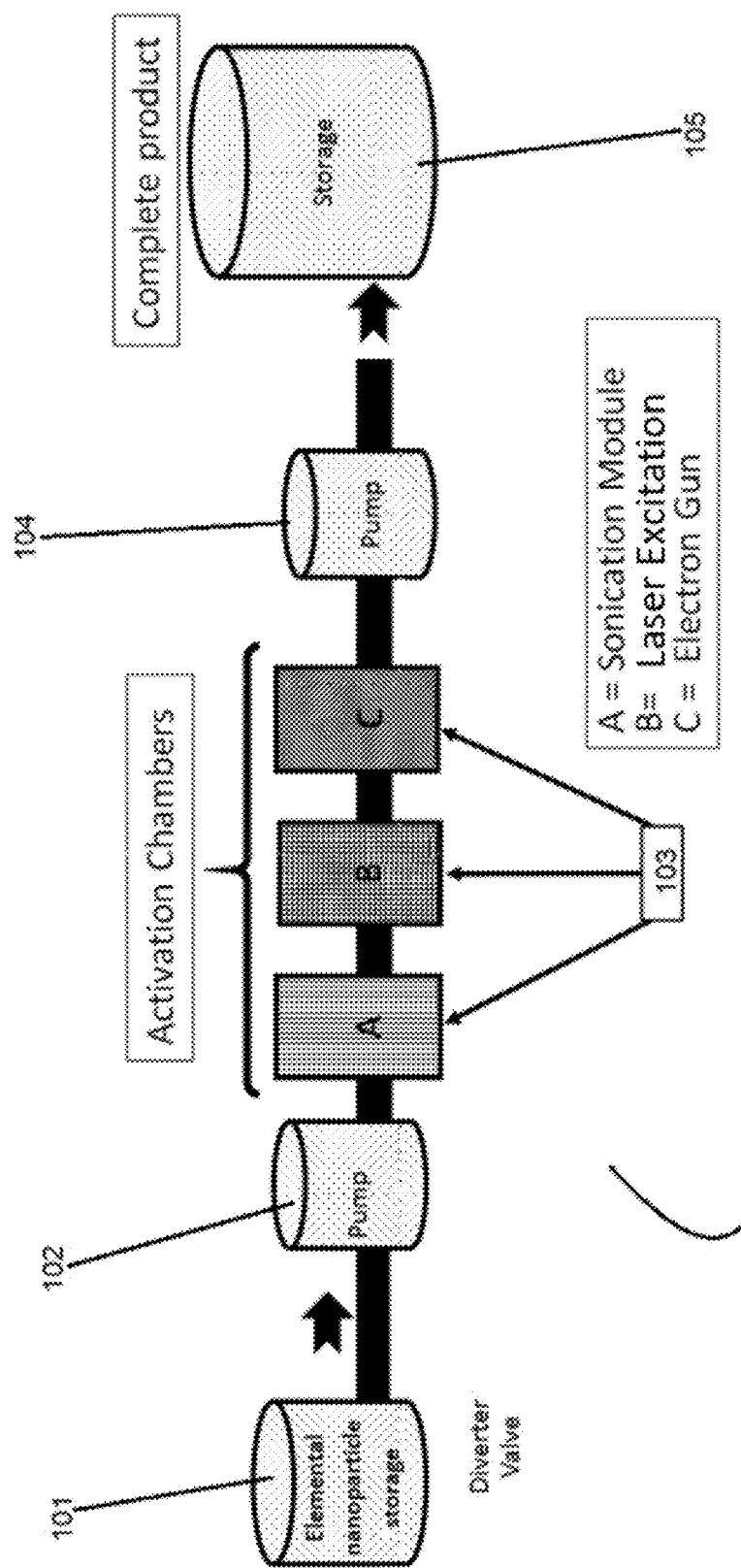
FIG. 1 illustrates a schematic representation of an embodiment of a system for producing the compositions described herein.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein. All references cited herein are expressly incorporated by reference herein in their entirety and for the specific disclosure referenced herein.

Provided herein are compositions and methods for controlling or mitigating the growth of pathogens that have a deleterious effect in global food production and plant health. Some embodiments relate to compositions that include a metal nanoparticle and an organic acid. In some embodiments, the composition is an activated composition. In some embodiments, the compositions are formulated for application to plants, or the compositions are formulated for administration to livestock or aquatic life. Some embodiments relate to methods of making the compositions. Some embodiments relate to methods of controlling a pathogen or methods of mitigating deleterious effects of a pathogen.

Demands on global food production output have consistently increased, putting a strain on the production of crops, food, and food products. Paralleled with the agriculture demand is the increasing demand to control pathogens that deleteriously effect agricultural output. The compositions, systems, and methods described herein relate to methods of increasing yield and decreasing the harmful effects of pathogens.

As used herein, the term "agriculture" has its ordinary meaning as understood in light of the specification, and refers to plant cultivation, aquaculture (farms for fish and crustaceans), or livestock production. Agriculture can include production of food, medicines, or products from plants, aquaculture, or livestock. The type of plants that may be cultivated, aquatic animals that may be produced, or livestock that are produced is not particularly limiting, and can include any tree, crop, aquatic animal, or livestock that has industrial, commercial, medical, recreational, ornamental, or aesthetic value.

Compositions

Embodiments provided herein relate to compositions that are used for mitigating, controlling, or reducing harmful effects caused by pathogens. In some embodiments, the compositions include a metal nanoparticle and an organic acid or a combination of metal nanoparticles and an organic acid.

As used herein, the term "metal nanoparticle" has its ordinary meaning as understood in light of the specification, and refers to a particle having an average diameter within the nanometer range, and includes one or more metals. The nanoscale dimension and high surface area to volume ratio of nanoparticles makes their physicochemical properties distinct from those of bulk materials, which makes nanomaterials capable of being applied in diverse agricultural uses. In some embodiments, the metal nanoparticles in the composition have an average diameter ranging from about 1 nm to about 500 nm, for example, 1, 2, 3, 4, 5, 6, 7, 8, 9, 10, 11, 12, 13, 14, 15, 16, 17, 18, 19, 20, 21, 22, 23, 24, 25, 30, 35, 40, 45, 50, 60, 70, 80, 90, 100, 150, 200, 250, 300, 350, 400, 450, or 500 nm, or an average diameter within a range defined by any two of the aforementioned values. In some embodiments, the metal nanoparticles in the composition have an average diameter ranging from 5 nm to 20 nm. In some embodiments, the metal nanoparticle include a single metal or a combination of metals. In some embodiments, the metal is gold, silver, magnesium, zinc, calcium, manganese, copper, palladium, nickel, platinum, titanium, cerium, iron, thallium, molybdenum, or an alloy, oxide, hydroxide, sulfide, nitrate, phosphate, fluoride, or chloride thereof. In some embodiments, the composition is a matrix fluid.

As used herein, the term "matrix" has its ordinary meaning as understood in light of the specification, and refers to a mixture in which one substance of microscopically dispersed insoluble particles is suspended throughout another substance. Thus, in some embodiments, the composition includes dispersed or suspended elemental molecules or nanoparticles. In the scope of the disclosure, a matrix fluid refers to a composition that has been activated using any one or more of the activation means.

As used herein, the term "organic acid" has its ordinary meaning as understood in light of the specification, and refers to an organic compound having acid properties, including salts thereof. The organic acid can include, for example, any one or more of tannic acid, citric acid, trisodium citric acid, acetic acid, oxalic acid, tartaric acid, succinic acid, maleic acid, fumaric acid, gluconic acid, malic acid, ascorbic acid, benzoic acid, palmitic acid, alginic acid, polyglutamic acid, naphthalenesulfonic acid, methanesulfonic acid, p-toluenesulfonic acid, naphthalenedisulfonic acid, polygalacturonic acid, malonic acid, sulfosalicylic acid, glycolic acid, 2-hydroxy-3-naphthoate, pamoate, salicylic acid, stearic acid, phthalic acid, mandelic acid, or lactic acid, or combinations thereof.

In some embodiments, selection of the metal to be used in the metal nanoparticle and selection of the organic acid in the composition is determined based on the environmental impact of the compounds when applied to agriculture systems, such that the composition has minimal, negligible, or undetectable impact on the environment. In some embodiments, selection of the metal to be used in the metal nanoparticle and selection of the organic acid in the composition is determined based on the effects on humans or on the agricultural target, such that the composition has minimal, negligible, or undetectable harmful effects on humans or on the agricultural target. In some embodiments, selection of the metal to be used in the metal nanoparticle and selection of the organic acid in the composition is determined based on the inhibition or mitigation of a harmful pathogen, such that the composition effectively eliminates, inhibits, kills, slows, or prevents growth of the pathogen. In some embodiments, the selection of the metal to be used in the metal nanoparticle and selection of the organic acid in the composition is selected based on a combination of the components compatibility, storage, applicability, shipment, or other physical properties that would render the composition efficacious for its intended purpose. In some embodiments, the selection of the metal to be used in the metal nanoparticle and the selection of the organic acid is a combination of any of the aforementioned properties of environmental impact, human or agricultural health effects, pathogenic efficacy, and/or compatibility, or other considerations, such as commercial, cost, or availability of the components.

In some embodiments, any metal nanoparticle described herein is present in the composition in an amount of less than about 1% of the amount of an active ingredient in the composition. In some embodiments, any metal nanoparticle described herein may be present in the composition in an amount of less than about 1% of the amount of the organic acid, or combination or organic acids, in the composition. For example, any metal nanoparticle described herein may be present in the composition in an amount of less than about 0.01%, 0.05%, 0.1%, 0.2%, 0.3%, 0.4%, 0.5%, 0.6%, 0.7%, 0.8%, 0.9%, or 1% of an active ingredient or of the organic acid. In some embodiments, any metal nanoparticle described herein is present in the composition in an amount ranging from about 1 ppm to about 50,000 ppm, such as 1, 2, 3, 4, 5, 6, 7, 8, 9, 10, 15, 20, 25, 30, 35, 40, 450, 50, 55, 60, 65, 70, 75, 80, 85, 90, 95, 100, 150, 200, 250, 300, 350, 400, 450, 500, 600, 700, 800, 900, 1000, 1500, 2000, 2500, 3000, 3500, 4000, 4500, 5000, 5500, 6000, 6500, 7000, 7500, 8000, 8500, 9000, 9500, 10000, 15000, 20000, 25000, 30000, 35000, 40000, 45000, or 50000 ppm, or in an amount within a range defined by any two of the aforementioned values. In some embodiments, the concentration of the metal nanoparticles in the composition varies depending on the particular use of the composition. For example, a composition that may be used for curative purposes may include metal nanoparticles in an amount of about 60 ppm, whereas a composition that may be used for preventative purposes may include metal nanoparticles in an amount ranging from about 15 ppm to about 30 ppm.

In some embodiments, the organic acid or salts thereof, or combination of organic acids or salts there is present in the composition in an amount ranging from about 1% w/v to about 100% w/v, such as 1, 2, 3, 4, 5, 6, 7, 8, 9, 10, 15, 20, 25, 30, 35, 40, 45, 50, 55, 60, 65, 70, 75, 80, 85, 90, or 100% w/v, or in an amount within a range defined by any two of the aforementioned values. In some embodiments, the organic acid is citric acid, present in an amount ranging from about 1% to about 10%, such as 1, 2, 3, 4, 5, 6, 7, 8, 9, or 10% w/v. In some embodiments, the citric acid is present in an amount of about 3.6% w/v. In some embodiments, the citric acid is present in an amount of about 4.5% w/v. In some embodiments, the organic acid or combination of organic acids is present in the composition in an amount ranging from about 10 ppm to about 1,000,000 ppm, such as 10, 20, 30, 40, 50, 60, 70, 80, 90, 100, 200, 300, 400, 500, 600, 700, 800, 900, 1000, 1500, 2000, 2500, 3000, 3500, 4000, 4500, 5000, 6000, 7000, 8000, 9000, 10000, 15000, 20000, 25000, 30000, 35000, 40000, 45000, 50000, 60000, 70000, 80000, 90000, 100000, 110000, 120000, 130000, 140000, 150000, 160000, 170000, 180000, 190000, 200000, 250000, 300000, 350000, 400000, 450000, 500000, 550000, 600000, 650000, 700000, 750000, 800000, 850000, 900000, 950000, or 1000000 ppm, or in an amount within a range defined by any two of the aforementioned values.

In some embodiments, the organic acid or combination of organic acids may be selected to control the size and/or dispersiveness of the metal nanoparticles in the composition. For example, the type of organic acid, the concentration of the organic acid, and other properties of the composition may be used to control the size and/or dispersiveness of the metal nanoparticles.

In some embodiments, the composition may include components that facilitates application of the composition to a plant, aquatic life, or livestock. In some embodiments, the composition further includes other chemical components, such as diluents or carriers. As used herein, a "diluent" has its ordinary meaning as understood in light of the specification, and refers to an ingredient in a composition that lacks activity but may be necessary or desirable. For example, a diluent may be used to increase the bulk of an ingredient. It may also be a liquid for the dissolution or dispersal of an ingredient to be applied. A common form of diluent in the art is an aqueous solution that is compatible with plant, aquaculture, or livestock application, such that the composition does not adversely affect the growth of plants, aquatic life, or livestock. A "carrier" has its ordinary meaning as understood in light of the specification and refers to a substance, not itself an active ingredient, which may facilitate the application of the composition to a plant, aquatic life, or livestock. The carrier may be a liquid for the dissolution of a compound. The carrier may improve the stability, handling, storage, shipment, or application properties of the composition.

In some embodiments, the compositions further include a surfactant. As used herein, "surfactant" has its ordinary meaning as understood in light of the specification, and includes compounds that lower the surface tension (or interfacial tension) between two liquids or between a liquid and a solid and includes emulsifying agents, emulsifiers, detergents, wetting agents, and surface-active agents. As used herein, the term "emulsifier" refers to a substance that stabilizes a mixture of two or more liquids that are normally immiscible (an emulsion). In some embodiments, the surfactant includes glycerol, alkylbenzenesulfonate, ammonium lauryl sulfate, sodium lauryl sulfate (sodium dodecyl sulfate, SLS, or SDS), sodium laureth sulfate (sodium lauryl ether sulfate or SLES), sodium myreth sulfate, dioctyl sodium sulfo succinate (Docusate), perfluorooctanesulfonate (PFOS), perfluorobutanesulfonate, alkyl-aryl ether phosphates, alkyl ether phosphates, sodium stearate, sodium lauroyl sarcosinate, perfluorononanoate, and perfluorooctanoate (PFOA or PFO). In some embodiments, the compositions include an emulsifier present in an amount of ranging from about 0.001% to about 10%, such as 0.001, 0.005, 0.01, 0.05, 0.1, 0.5, 1, 1.5, 2, 2.5, 3, 3.5, 4, 4.5, 5, 5.5, 6, 6.5, 7, 7.5, 8, 8.5, 9, 9.5, or 10%, or in an amount within a range defined by any two of the aforementioned values.

In some embodiments, the composition is formulated as a solution, a spray, a mist, a seed coating, an electrostatically charged seed powder, or a powder. In some embodiments, the seed coating includes micro nutrients. In some embodiments, the seed coating including micronutrients promotes improved seedling emergence or survival. In some embodiments, the seed coating including micronutrients promotes increased yields. In some embodiments, the compositions formulated as a seed coating is used for seed storage. In some embodiments, the seed coating is a conglomerate mixture with nutrients used to coat a plant seed. In some embodiments, the seed coating protects the plant seed from harmful pathogens, such as fungi or bacteria during storage. In some embodiments, the seed coating allows for uniform size of plant seeds for bulk planting techniques. In some embodiments, the seed coating increases germination rates, increases seedling survival, and/or increases crop yields.

In some embodiments, the composition is formulated for application to a crop by spraying, misting, soaking, watering, soil drenching, crop-dusting, or otherwise applying the composition to the plants, the portion of the plants, or components of the plants. In some embodiments, the composition is applied to the plant itself, such as to the leaves, stem, trunk, stalk, flowers, branches, fruits, roots, shoots, buds, rhizome, seeds, or other portions of the plant, or it is applied to the soil in which or around which the plant is being cultivated. In some embodiments, the composition is formulated as a powder that is applied to the plant or to plant parts, such as applied to harvested seeds, leaves, stem, trunk, stalk, flowers, branches, fruits, roots, shoots, buds, rhizome, or other portions of the plant, or to the soil in which or around which the plant is being cultivated. In some embodiments, the composition is formulated together with a fertilizer or micro-nutrient for application to a plant. Such fertilizers or nutrients may include, for example, trace minerals, phosphorus, potassium, sulfur, manganese, magnesium, calcium, and/or any one or more of 90 trace elements. In some embodiments, the composition is formulated as a concentrated composition that may be diluted prior to application. For example, the composition may be formulated as a liquid concentrate that may be diluted with a solution, such as with water, or it may be formulated as a solid, such as a powder, for dissolution in a solution, such as water. In some embodiments, the composition may be formulated as a ready-to-use composition. For example, the composition may be formulated as a solution that includes the appropriate concentrations of component parts for direct application to a plant or may be formulated as a solid for direct application to a plant.

In some embodiments the composition is formulated for application to aquatic life or livestock, for example, as a composition for topical application to livestock, such as a spray, mist, solution, salve, or ointment formulation, or for ingestion by livestock, such as distribution of the composition in feed of the livestock, or in the livestock environment. For example, the composition can be deposited in water in which aquatic animals are being cultivated, the composition can be incorporated into feed that is provided to aquatic life or livestock, incorporated into livestock water sewage storage lakes or ponds to kill bacterium, virus, or fungi, or the composition can be applied to plants that field livestock ingest.

In any of the embodiments of the compositions provided herein, the compositions are non-toxic and include component parts that exhibit no toxic effects to humans, to the agriculture that is being treated, or to the environment, including no toxicity to ground water, flora, or fauna. In any of the embodiments of the compositions provided herein result in improved agricultural health, including improved plant health and/or improved crop production, or improved aquaculture or livestock health. Furthermore, embodiments of the composition provided herein enable ease in application of the composition, and reduced quantities of composition to be used in agricultural application.

Some embodiments provided herein relate to a kit that includes the composition and an applicator. In some embodiments, the kit is a ready-to-use kit, wherein the composition included in the kit is ready to use by the user without further alterations. In some embodiments, the composition is provided in the kit in a container for application to agriculture. In some embodiments, the container is a spray applicator containing the composition. In some embodiments, the composition is a concentrated liquid, or a solid. In such embodiments, the composition may be added to a liquid, such as water, to dilute the concentrated liquid or to dissolve the solid composition. In some embodiments, the composition is a diluted composition. In some embodiments, the spray applicator is configured for industrial, commercial, home-gardener, or recreational purposes. In some embodiments, the kit includes a dispensing apparatus, such as a nozzle, a valve, a sprayer, or any other apparatus capable of dispensing the compositions described herein to a crop, aquaculture, or livestock.

In any of the embodiments of the compositions described herein, the composition is formulated as a matrix fluid. In some embodiments, the matrix fluid is formulated as described herein. In some embodiments, the matrix fluid includes one or more metal nanoparticles and one or more organic compounds. In some embodiments, the matrix fluid exhibits energy frequency interactions within the suspended particles in the matrix fluid. In some embodiments, the energy frequency interactions are dictated by quantum mechanics forces. In some embodiments, the energy frequency interactions are tunable. In some embodiments, the energy frequency interactions are modulated using excitations that disrupt or activate quantum mechanics fields of suspended particles in the matrix solution. In some embodiments, the excitations may be generated using sonication, electron gun, ultra-low frequency vibrations, thermal excitation, ultra-high frequency audio excitation, electro-acoustical excitation, electro-magnetic excitation, laser excitation, or other means for disrupting or activating a quantum mechanics field. Methods of making the composition, including the matrix fluid are described herein in greater detail.

Methods of Making Compositions

Some embodiments provided herein relate to systems and methods of making compositions as described herein. In some embodiments, the methods include synthesis of metal nanoparticles. Metal nanoparticles may be synthesized by chemical or physical means. For example, metal salts may be in a chemical reaction with a reducing agent to reduce the ionic metal to elemental metal in a nanoparticle form. Such reduction methods can include contacting the ionic metal with organic compounds, or organic reducers, such as sodium sulfite. Without wish to be bound by theory, reduction of ionic metal to elemental metal using organic compounds directs the synthesis of nanoparticle formation, controlling the size of the nanoparticles and tailoring the surface of the nanoparticle. Certain organic reductants, such as tannic acid, may be used due to the harmless and environmentally friendly properties of tannic acid. Tannic acid is a plant derived polyphenolic compound, and is efficacious in reducing ionic metal and stabilizing nanoparticle formations. Thus, in some embodiments, the metal nanoparticles are formed using tannic acid mediated synthesis. In some embodiments, the methods include mixing an ionic metal with a reducing agent or with an organic acid. In some embodiments, the organic acid includes any one or more of tannic acid, citric acid, tri-sodium citric acid, acetic acid, oxalic acid, tartaric acid, succinic acid, maleic acid, fumaric acid, gluconic acid, malic acid, ascorbic acid, benzoic acid, palmitic acid, alginic acid, polyglutamic acid, naphthalenesulfonic acid, methanesulfonic acid, p-toluenesulfonic acid, naphthalenedisulfonic acid, polygalacturonic acid, malonic acid, sulfosalicylic acid, glycolic acid, 2-hydroxy-3-naphthoate, pamoate, salicylic acid, stearic acid, phthalic acid, mandelic acid, or lactic acid, or combinations thereof. In some embodiments, the organic acid is a natural reagents, including, for example, tannic acid, citric acid, and/or tri-sodium citrate. In some embodiments, the metal nanoparticles are formulated having an average diameter ranging from about 1 nm to about 500 nm, for example, 1, 2, 3, 4, 5, 6, 7, 8, 9, 10, 11, 12, 13, 14, 15, 16, 17, 18, 19, 20, 21, 22, 23, 24, 25, 30, 35, 40, 45, 50, 60, 70, 80, 90, 100, 150, 200, 250, 300, 350, 400, 450, or 500 nm, or an average diameter within a range defined by any two of the aforementioned values. In some embodiments, the metal nanoparticles are formulated having an average diameter ranging from 5 nm to 20 nm. In some embodiments, the size of the nanoparticles is modulated based on the type and quantity of reducing agent present in the composition. In some embodiments, the metal nanoparticles include a single metal or a combination of metals. In some embodiments, the metal is gold, silver, magnesium, zinc, calcium, manganese, copper, palladium, nickel, platinum, titanium, cerium, iron, thallium, molybdenum, or an alloy, oxide, hydroxide, sulfide, nitrate, phosphate, fluoride, or chloride thereof. In some embodiments, additional components or materials may be added to the composition at various stages of the manufacturing process.

In some embodiments, the methods include obtaining pre-synthesized metal nanoparticles mixed in pure water or in a matrix fluid described herein. In some embodiments, the pre-synthesized metal nanoparticles have a diameter ranging from about 1 nm to about 500 nm, including, for example, 1, 2, 3, 4, 5, 6, 7, 8, 9, 10, 11, 12, 13, 14, 15, 16, 17, 18, 19, 20, 21, 22, 23, 24, 25, 30, 35, 40, 45, 50, 60, 70, 80, 90, 100, 150, 200, 250, 300, 350, 400, 450, or 500 nm, or a diameter within a range defined by any two of the aforementioned values. In some embodiments, the metal nanoparticles, whether manufactured as described herein or obtained pre-synthesized are subjected to sonication. In some embodiments, the sonication reduces nanoparticle agglomeration, solubilizes, and/or disperses the metal nanoparticles in solution.

Without wishing to be bound by theory, a mechanism of inhibitory action of metal nanoparticles on microorganisms may include the loss of ability of plant DNA to replicate acrospores, resulting in inactivated expression of ribosomal subunit proteins and certain other cellular proteins and enzymes essential to ATP production. Further, ionic and/or cationic charges primarily affect the membrane integrity, such as permeability, of membrane-bound enzymes, such as those in the respiratory chain. In summary, elemental metal nanoparticles exert potent anti-pathogenic effects on agricultural pathogens, including plant, aquaculture, or livestock pathogens. Pathogenic inhibition may occur through destruction of membrane integrity. Pathogenic inhibition and fluid matrix mechanisms may also inhibit spore growth and asexual reproduction. In some embodiments, pathogenic inhibition increase food production yield, such as increases yield of crops (in the case of plants) or animals for food (in the case of aquaculture or livestock).

In some embodiments, the metal nanoparticles are further processed to generate a matrix fluid. Thus, some embodiments provided herein relate to methods of generating a composition comprising metal nanoparticles and an organic acid, wherein the composition is generated as a matrix fluid. In some embodiments, the matrix fluid is altered by energy frequency interactions between the metal nanoparticles, which are dispersed or suspended in the matrix fluid. In some embodiments, the matrix fluid includes ionic, electronic, or quantum mechanics properties that can increase ions in the fluid matrix In some embodiments, the methods include modulating the ionic, electronic, and/or quantum mechanics properties of the matrix fluid by contacting the composition with an energy source using excitations that disrupt or activate quantum mechanics fields of the suspended particles. In some embodiments, the matrix fluid exhibits alteration or modification of the quantum characteristics of suspended metallic nanoparticles. In some embodiments, the methods increase electron ion activity in the fluid matrix. In some embodiments, the quantum characteristics include precise energy manipulations or vibrational motion of ionic radii, which can be modulated within the matrix fluid such that the dispersed particles can be rendered effectively “charged” at predictable levels, thereby exhibiting either an attractive or repulsive force between other suspended particles. Without wishing to be bound by theory, a relationship between the free electrons in the matrix fluid significantly affects the composition efficacy in controlling or mitigating plant, aquaculture, or livestock pathogens. In some embodiments, the quantum characteristics can be turned on (static) or off (dynamic). This process allows production of a matrix fluid with far greater particle charges than naturally occur in nature, thus increasing efficacy.

In the scope of the disclosure, a matrix fluid refers to a composition that has been activated using any one or more of the activation means. In some embodiments, the activated composition (the matrix fluid) may have an altered viscosity compared to a composition that is not activated.

In some embodiments, the excitations may be generated using sonication, electron gun, ultra-low frequency vibrations, thermal excitation, ultra-high frequency audio excitation, electro-acoustical excitation, electro-magnetic excitation, laser excitation, or other means for disrupting or activating a quantum mechanics field.

As used herein, the term "quantum mechanics" in the context of the matrix fluid has its ordinary meaning as understood in light of the specification, and refers to a mathematical description of the motion and interaction of atomic and subatomic particles in the matrix fluid, including the motion and interaction of atomic and subatomic particles in the metal nanoparticles.

Some embodiments provided herein relate to systems for making the matrix fluid compositions described herein. In some embodiments, the systems include a fluid treatment apparatus having a water distillation system and an altered water storage tank. In some embodiments, the systems include a distilled water production system. In some embodiments, the systems include a dropping funnel sitting atop a flask having a stirrer. In some embodiments, the flask is used for generation of the metal nanoparticles, which are generated at a target diameter size using one or more organic acids. In some embodiments, the systems include a matrix fluid stabilization storage tank. In any embodiment provided herein, the systems include one or more process pumps, and a liquid flow path (such as hosing or tubing) for conveyance of liquids to various component parts of the system. In any embodiment provided herein the systems further include a low voltage-high amperage variable power supply. In any embodiments, the systems further include one or more activation chamber.

FIG. 1 depicts an exemplary system 100 for making a matrix fluid composition as described herein. As shown in FIG. 1, metal nanoparticles that are formulated may be retained in an elemental nanoparticle storage container 101. The elemental nanoparticle storage container 101 is not particularly limiting in size, and can be any size ranging from a few liters to many several hundreds of gallons, such as about 1, 2, 3, 4, or 5 liters, or about 1, 2, 3, 4, 5, 6, 7, 8, 9, 10, 15, 20, 25, 30, 35, 40, 45, 50, 60, 70, 80, 90, 100, 110, 120, 130, 140, 150, 160, 170, 180, 190, 200, 250, 300, 350, 400, 450, 500, 550, 600, 650, 700, 750, 800, 850, 900, 950, or 1000 gallons, or in an amount within a range defined by any two of the aforementioned values. The systems may include one or more storage containers. In some embodiments, the systems include one or more storage containers that feed to the elemental nanoparticle storage container 101.

As shown in FIG. 1, the metal nanoparticles flow from the elemental nanoparticle storage 101 through a flow pathway to a pump 102, and from the pump 102 to one or more activation chambers, 103 chamber A, 103 chamber B, or 103 chamber C. The composition that includes the metal nanoparticles can flow through the flow pathway through a diverter valve. The pump 102 can flow the composition through the system at a rate of ranging from less than about one liter per minute to more than about 50 gallons per minute, such as 1, 2, 3, 4, or 5 liters or 1, 2, 3, 4, 5, 6, 7, 8, 9, 10, 15, 20, 25, 30, 35, 40, 45, or 50 gallons per minute, or at a flow rate within a range defined by any two of the aforementioned values. The systems may include one or more pumps as necessary for flow of the composition through the system.

As shown in FIG. 1, the activation chambers 103 are a sonication module 103 A, laser excitation 103 B, and an electron gun 103 C. In some embodiments, the composition flows into one or more of activation chambers 103 A, 103 B, or 103 C. For example, the composition may flow into activation chamber 103 A, 103 B, 103 C, 103 A and 103 B, 103 A and 103 C, 103 A and 103 B and 103 C, or 103 B and 103 C. In some embodiments, the systems include one or more activation chambers, such as 1, 2, 3, 4, 5, 6, or more activation chambers, and the composition can flow into any one or more of any of the activation chambers, including in any order.

As shown in FIG. 1, the sonication module 103 A applies energy to the composition, such as sound energy, which disrupts, activates, or agitates the molecules in the composition. In some embodiments, the sonication module 103 A increases nanoparticle densities at levels greater than could be achieved without activation. In some embodiments, the sonication increases ionic activity and/or increases phonons above ionic threshold that would be considered normal without activation. The sonication module 103 A can include application of ultrasonic frequencies in the range of 20 kHz to 1 MHz, such as an ultrasonic frequency of about 20, 21, 22, 23, 24, 25, 26, 27, 28, 29, 30, 31, 32, 33, 34, 35, 36, 37, 38, 39, 40, 50, 60, 70, 80, 90, 100, 150, 200, 250, 300, 350, 400, 450, 500, 600, 700, 800, 900, or 1000 kHz, or at a frequency within a range defined by any two of the aforementioned values. Sonication may be applied to the composition for a period of time sufficient to modulate the quantum mechanics of the composition to generate a matrix fluid, for example, for a time period ranging from one minute to several hours, such as about 1, 2, 3, 4, 5, 6, 7, 8, 9, 10, 15, 20, 25, 30, 35, 40, 45, 50, 55, or 60 minutes, or 1, 2, 3, 4, 5, 6, 7, 8, 9, 10, 11, or 12 hours, or for an amount of time within a range defined by any two of the aforementioned values. In some embodiments, the sonication module 103 A includes a sonication probe or a sonication bath.

As shown in FIG. 1, the laser excitation 103 B applies laser energy to the composition. The laser emits energy based on stimulated emission of electromagnetic radiation. In some embodiments, the laser emits energy at a wavelength ranging from about 150 nanometers to about 1 millimeters, such as 150, 200, 250, 300, 350, 400, 450, 500, 550, 600, 650, 700, 750, 800, 850, 900, 950, or 1000 nanometers, or 1, 2, 3, 4, 5, 6, 7, 8, 9, 10, 15, 20, 25, 30, 35, 40, 45, 50, 60, 70, 80, 90, 100, 200, 300, 400, 500, 600, 700, 800, 900 or 1000 micrometers, or at a wavelength within a range defined by any two of the aforementioned values. Any suitable laser can be used in the system, including for example a gas laser (such as a helium-neon laser, an argon laser, a krypton laser, a xenon ion laser, a nitrogen laser, a carbon dioxide laser, a carbon monoxide laser, or an excimer laser), a chemical laser (such as a hydrogen fluoride laser, a deuterium fluoride laser, a chemical oxygen-iodine laser, or al all gas-phase iodine laser), a dye laser (such as a stilbene, coumarin, or rhodamine laser), a metal-vapor laser (such as a helium-cadmium metal-vapor laser, helium-mercury metal-vapor laser, helium-selenium metal-vapor laser, helium-silver metal-vapor laser, strontium vapor laser, neon-copper metal-vapor laser, copper vapor laser, gold vapor laser, or manganese vapor laser), a solid-state laser (such as a ruby laser, a neodymium (Nd):yttrium aluminum garnet (YAG) laser, a NdCrYAG laser, an Er:YAG laser, a neodymium doped yttrium orthovanadate laser, a neodymium doped yttrium calcium oxoborate laser, a neodymium glass laser, a titanium sapphire laser, a thulium YAG laser, a ytterbium YAG laser, a ytterbium:$_2$O$_3$ laser, a ytterbium doped glass laser, a holmium YAG laser, a chromium ZnSe laser, a cerium doped lithium strontium or calcium aluminum fluoride laser, a promethium 147 doped phosphate glass laser, a chromium doped chrysoberyl alexandrite laser, an erbium doped and erbium-ytterbium codoped glass laser, a trivalent uranium doped calcium fluoride laser, a divalent samarium doped calcium fluoride laser, or a Farbe-center laser), a semiconductor laser (such as a semiconductor laser diode, a GaN, an InGaN, an AlGaInP, an AlGaAs, an InGaAsP, a lead salt, a vertical cavity surface emitting laser, a quantum cascade laser, or a hybrid silicon laser), a free electron laser, a gas dynamic laser, a nickel-like Samarium laser, a Raman laser, a nuclear pumped laser, a gamma-ray laser, a fiber laser, a photonic crystal laser, or a gravity laser, or any combination thereof. The laser energy may be applied to the composition at a power ranging from about 1 mW to about 1000 mW, such as about 1, 2, 3, 4, 5, 6, 7, 8, 9, 10, 15, 20, 25, 30, 40, 50, 60, 70, 80, 90, 100, 200, 300, 400, 500, 600, 700, 800, 900, or 1000 mW, or in an amount within a range defined by any two of the aforementioned values. The laser energy can be applied to the composition for a period of time sufficient to sufficiently disrupt or activate the particles in the matrix fluid, so as to modulate the quantum mechanics of the matrix fluid. For example, the laser energy may be applied to the composition for a period of time ranging from one minute to several hours, such as about 1, 2, 3, 4, 5, 6, 7, 8, 9, 10, 15, 20, 25, 30, 35, 40, 45, 50, 55, or 60 minutes, or 1, 2, 3, 4, 5, 6, 7, 8, 9, 10, 11, or 12 hours, or for an amount of time within a range defined by any two of the aforementioned values.

As shown in FIG. 1, the electron gun 103 C applies kinetic energy to the composition by emitting an electron beam, which destabilizes, disrupts, activates, or agitates the molecules in the composition. The electron gun may generate an electric field, or my emit electrons using thermionic, photocathode, cold emission, or plasma emission, or may generate electrostatic or magnetic fields. In some embodiments, the electron gun 103 C increases electron ion activity in the matrix fluid or increasing particle ions above thresholds that would be considered normal without activation. In some embodiments, the electron gun 103 C includes one or more electrodes. The electron gun can be applied to the composition for a period of time sufficient to sufficiently disrupt or activate the particles in the matrix fluid, so as to modulate the quantum mechanics of the matrix fluid. For example, the electron gun may be applied to the composition for a period of time ranging from one minute to several hours, such as about 1, 2, 3, 4, 5, 6, 7, 8, 9, 10, 15, 20, 25, 30, 35, 40, 45, 50, 55, or 60 minutes, or 1, 2, 3, 4, 5, 6, 7, 8, 9, 10, 11, or 12 hours, or for an amount of time within a range defined by any two of the aforementioned values.

The system of FIG. 1 can further include additional activation chambers, including, for example, thermal excitation, electro-magnetic excitation, electro-acoustical excitation. Thermal excitation can be used for increasing nanoparticle densities above flocculation thresholds that would be considered normal without activation.

As shown in FIG. 1, the system for making the matrix fluid composition further includes a pump 104. The pump 104 can flow the matrix fluid composition from the one or more activation chambers 103 to a storage container 105. The pump 104 can flow the matrix fluid composition through the system at a rate of ranging from less than about one liter per minute to more than about 50 gallons per minute, such as 1, 2, 3, 4, or 5 liters or 1, 2, 3, 4, 5, 6, 7, 8, 9, 10, 15, 20, 25, 30, 35, 40, 45, or 50 gallons per minute, or at a flow rate within a range defined by any two of the aforementioned values. The storage container 105 is a container that is capable of storing the matrix fluid compositions. The storage container 105 can be of any size sufficient to store the matrix fluid composition for a period of time prior to shipment of the matrix fluid composition, or prior to applied usage of the matrix fluid composition. For example, the storage container can have a volume that ranges from 10 gallons to 10000 gallons, such as 10, 20, 30, 40, 50, 100, 150, 200, 250, 300, 350, 400, 450, 500, 600, 700, 800, 900, 1000, 1100, 1200, 1300, 1400, 1500, 2000, 2500, 3000, 3500, 4000, 4500, 5000, 6000, 7000, 8000, 9000, or 10000 gallons, or a volume within a range defined by any two of the aforementioned values. In some embodiments, the matrix fluid composition is stored within the storage container 105 for a period of time ranging from about 10 minutes to about 2 years, such as 10, 20, 30, 40, 50, or 60 minutes, or 1, 2, 3, 4, 5, 6, 7, 8, 9, 10, 11, 12, 13, 14, 15, 16, 17, 18, 19, 20, 21, 22, 23, or 24 hours, or 1, 2, 3, 4, 5, 6, or 7 days, or 1, 2, 3, 4, or 5 weeks, or 1, 2, 3, 4, 5, 6, 7, 8, 9, 10, 11, or 12 months, or 1 or 2 years, or for a period of time within a range defined by any two of the aforementioned values. In some embodiments, the matrix fluid composition is immediately utilized for treating pathogen in agricultural applications, such that the matrix fluid composition is not stored in the storage container 105. In some embodiments, the systems include one or more storage containers for storage of the complete product.

In some embodiments, additional compounds, such as carriers, diluents, surfactants, or emulsifiers, may be added to the composition at various stages in the system. For example, in some embodiments, an additional compound is added to the composition prior to activation in the activation chambers 103. In some embodiments, the additional compound is added to the composition after activation in the activation chambers 103. In some embodiments, the additional compound is added to the composition during activation in the activation chambers 103.

In some embodiments, the systems further include one or more centrifuge for removing insoluble particulate matter. In some embodiments, a centrifuge is used on the composition prior to flowing the composition to the elemental nanoparticle storage container 101. In some embodiments, a centrifuge is used on the composition prior to flowing the composition to the one or more activation chambers 103. In some embodiments, a centrifuge is used on the composition prior to storage of the activated composition in the storage container 105. The composition may be subjected to centrifugal force in the centrifuge in an amount ranging from about 1000×g to about 100,000×g, such as 1000, 1500, 2000, 2500, 3000, 3500, 4000, 4500, 5000, 5500, 6000, 6500, 7000, 7500, 8000, 8500, 9000, 9500, 10000, 11000, 12000, 13000, 14000, 15000, 16000, 17000, 18000, 19000, 20000, 30000, 40000, 50000, 60000, 70000, 80000, 90000, or 100000×g, or in an amount within a range defined by any two of the aforementioned values. The composition can be subjected to centrifugal force in the centrifuge for a period of time sufficient to remove insoluble particulate matter, such as for a time ranging from about 1 minute to about 60 minutes, such as 1, 2, 3, 4, 5, 6, 7, 8, 9, 10, 15, 20, 25, 30, 35, 40, 45, 50, 55, or 60 minutes, or for a period of time within a range defined by any two of the aforementioned values.

In some embodiments, the matrix fluid compositions retains stability and/or activation for a period of time longer than the period of time that the matrix fluid composition is stored in the storage container 105. Thus, the matrix fluid compositions are stable for a period of at least about 2 years, such as at least 1, 2, 3, 4, 5, 6, 7, 8, 9, 10, 11, 12, 13, 14, 15, 16, 17, 18, 19, 20, 21, 22, 23, or 24 months, or for a period of time within a ranged defined by any two of the aforementioned valued. Stability of the matrix fluid composition can include, for example, stability of the metal nanoparticles, such that the metal nanoparticles remain dispersed or suspended in the matrix fluid composition, stability of the matrix fluid, such that the energy frequency interactions between the metal nanoparticles or between molecules in the matrix fluid remain disrupted or activated during the storage period. In some embodiments, the stability of the matrix fluid composition includes retaining stability such that the matrix fluid composition retains efficacy in mitigating, eliminating, inhibiting, killing, slowing, or preventing growth of a pathogen that affects agriculture. For example, the stability of the matrix fluid composition can retain its efficacy in treating agricultural pathogens in an amount ranging from about 25% to 100%, such as greater than 25, 30, 35, 40, 45, 50, 55, 60, 65, 70, 75, 80, 85, 90, 91, 92, 93, 94, 95, 96, 97, 98, 99 or 100% efficacy, or in an amount within a range defined by any two of the aforementioned values.

In any embodiments of the systems and methods of making the compositions, during generation of the matrix fluid, the compositions may be maintained at a constant temperature or to adjust the temperature to a target temperature. Thus, the systems may further include means for cooling or heating the composition in order to maintain a constant temperature, or in order to adjust the temperature to a target temperature. Means for cooling the composition may include, for example, refrigerated fluid lines, ice baths, cold air or cold liquid flow, ice slurry compressors, radiators, or other cooling means. Means for heating the composition may include, for example, hot air or hot liquid flow, electric heaters, electromagnetic induction heaters, or other heating means. In some embodiments, the composition is maintained at a temperature ranging from about 4° C. to about 95° C., such as 4, 5, 6, 7, 8, 9, 10, 11, 12, 13, 14, 15, 16, 17, 18, 19, 20, 21, 22, 23, 24, 25, 26, 27, 28, 29, 30, 35, 40, 45, 50, 55, 60, 65, 70, 75, 80, 85, 90, or 95° C., or at a temperature within a range defined by any two of the aforementioned values. In some embodiments, the temperature of the composition may be changed depending on whether the composition is in one or more of the activation chambers or in the storage container.

In any embodiments of the systems and methods for making the compositions, the systems can further include input conduits, output conduits, sampling valves, switches, pumps lines, hoses, housing, motors, fans, propellers, impellers, agitators, aerators, over-flow containers, thermometers, insulation, actuators, filters, concentrators, or other components. In some embodiments, any one or more of the aforementioned components is included in the system to contribute to efficiency of the system, to increase the ability to regulate or modify the composition manufacturing, or to comply with manufacturing requirements.

In any embodiments of the systems and methods for making the composition, the systems can be automated systems having computer processors, memory, circuits, sensors, monitors, real-time feedback loops, pumps, actuator, switches, algorithms, or any combination thereof, thereby enabling artificial intelligence programming to yield precise manufacture and generation of the compositions described herein. In some embodiments, the automated systems continuously regulate, monitor, and modulate the amount and duration of energy applied to the composition, whether by sonication, laser, or electron gun irradiation, or by any other energy source, and/or regulate, monitor, and modulate the flow rate of the composition through the system, and/or regulate, monitor, and modulate the temperature of the composition in the system. In some embodiments, the automated systems are capable of determining the degree of energy frequency interactions in the matrix fluid, and are capable of adjusting the energy frequency interactions by modulating the quantity and duration of energy input. In some embodiments, the automated systems modulate the blending and mixing of various components of the compositions, including ionic metals, reducing agents, organic acids, diluents, or carriers or other components of the compositions. In some embodiments, the automated systems may include a manual override such that a user may manually adjust the variables of the system, including the amount and duration of energy input, the flow rate, and/or the temperature. In some embodiments, the automated systems may be used for precise filed application requirements, wherein conditions may vary requiring custom product parameters. Thus, in any of the embodiments described herein, the systems and methods of making the compositions may be performed automatically, manually, or with timed control.

In any embodiments of the systems and methods for making the composition, the systems can be controlled remotely, such as by use of a phone application, remote computer control, or other remote control to regulate or control the system inputs from a remote location. In some embodiments, the systems and methods may include a remote alert system, configured for altering producing staff during production of the composition. Any of the remote systems described herein may be accomplished by cellphone, internet, landline communication, or other remote communication means.

In any embodiments of the systems and methods for making the composition, the systems further include a secondary power source. In some embodiments, the secondary power source acts as an alternative power source should a primary power source on a power grid fail. Examples of a dedicated power source include gasoline, propane, or diesel engine driven generators, solar cells, batteries, or other bankable power sources. In any of the embodiments provided herein, the power switching to the alternative power source may be accomplished by automated sensing of a failure of the primary power grid, or by manual switching to the alternative power source.

Methods of Use

Some embodiments provided herein relate to methods of using matrix fluid compositions provided herein for mitigating, eliminating, inhibiting, slowing, controlling, or preventing growth of a pathogen that affects agriculture, aquaculture, or livestock.

As used herein "mitigate" has its ordinary meaning as understood in light of the specification, and refers to alleviating or reducing a pathogen or alleviating or reducing harmful effects of the pathogen. As used herein "eliminate" has its ordinary meaning as understood in light of the specification, and refers to eradication of a pathogen or eradication of harmful effects of the pathogen. As used herein "inhibit" has its ordinary meaning as understood in light of the specification, and refers to a reduction in an amount of a pathogen or a reduction in harmful effects of the pathogen. As used herein "kill" has its ordinary meaning as understood in light of the specification, and refers to the destruction of a pathogen or destruction of harmful effects of the pathogen. As used herein "slow" has its ordinary meaning as understood in light of the specification, and refers to reducing the spread of a pathogen or reducing the harmful effects of the pathogen. As used herein "control" has its ordinary meaning as understood in light of the specification, and refers to maintaining influence over a pathogen or over harmful effects of the pathogen. As used herein "prevent" has its ordinary meaning as understood in light of the specification, and refers to disabling a pathogen or harmful effects of a pathogen. The terms mitigate, eliminate, inhibit, kill, slow, control, or prevent are not to be construed as 100%, and can include partial or complete mitigation, elimination, inhibition, death, slowing, control, or prevention of the pathogen or of harmful effects of the pathogen. For example, the mitigation, elimination, inhibition, death, slowing, control, or prevention can be of 10%, 20%, 30%, 40%, 50%, 60%, 70%, 80%, 90%, 100%, or an amount within a range defined by any two of the aforementioned values.

In some embodiments, the methods include treating agriculture having a pathogenic disease with the matrix fluid compositions described herein. As used herein, the terms "treating," "treatment," "therapeutic," or "therapy" do not necessarily mean total cure or abolition of the disease or condition.

As used herein "pathogen" has its ordinary meaning as understood in light of the specification, and refers to an organism that causes a disease in agriculture, particularly in a food crop, ornamental plants, fish and crustaceans, or livestock. The pathogen may include, for example a mold, mold spore, fungus, mutated fungus, fungi spore, bacterium, mutated bacterium, virus, mutated virus, nematode, mutated nematode, prion, or mutated prion, or any other plant, aquaculture, livestock, or soil pathogen. In some embodiments, the pathogen is a resistant pathogen that is resistant to pesticides in common use, which are therefore ineffective in treating the pathogen. In some embodiments, the pathogen is any pathogen that adversely effects the growth of plants, the appearance of plants, the production of plant food, cultivation of plants, or production of aquatic life or livestock, and is therefore not particularly limiting to any specific species or pathogen. In some embodiments, the pathogen is any and all forms of anthracnose or any and all types of *Fusarium* (including *F. oxysporum* f. sp. *Cubense* or *F. solani*), *Thielavopsis* (root rot), *Mycosphaerella* (including *M. fijiensis* and *M. musicola*), *Verticillium*, *Magnaporthe grisea*, *Sclerotinia sclerotiorum*, *Ustilago*, *Rhizoctonia* (including *R. solani*), *Cladosporium*, *Colletotrichum* (including *C. coccodes*, *C. truncatum*, or *C. gloeosporoides*), *Trichoderma* (including *T. viride* or *T. harzianum*), *Helminthosporium* (including *H. solani*), *Alternaria* (including *A. solani* or *A. alternata*), *Aspergillus* (including *A. niger* or *A. fumigatus*), *Phakospora pachyrhizi*, *Puccinia*, *Armillaria*, oomycetes (such as *Pythium* or *Phytophthora*, including *Phytophthora infestans* or *Phytophthora cinnamoni*), phytomyxea (such as *Plasmodiophora* or *Spongospora*), *Erwinia*, *Burholderia*, *Proteobacteria* (such as *Xanthomonas* or *Pseudomonas*), *Pectobacterium* (including *P. carotovorum*), *Dickeya* (including *D. dianthicola*), *Agrobacterium* (including *A. tumefaciens*), *Xanthomonas* (including *X. vesicatoria* or *X. campestris*), *Clavibacter* (including *C. michiganensis*), phytoplasmas, spiroplasmas, Bigeminivirus, Monogeminivirus, Hybrigeminivirus, Ipomovirus, Macluravirus, Nanavirus, Ourmiavirus, Satellite RNA, Satellivirus, Varicosavirus, viroids, nematodes (such as *Globodera*), protozoa (such as Phytomonas), or algae (such as Cephaleuros). Further examples of pathogens that are harmful to aquatic life, and which may be mitigated or inhibited using the compositions described herein include, for example, *Aeromonas* (including for example, *A. hydrophila* or *A. salminocida*), *Pseudomonas* (including, for example, *P. fluorescens*), *Photobacterium*, *Vibrio* (including, for example, *V. anguillarum, V. salmonicida, V. alginolyticus, V. costicola, V. harveyi, V. splendidus, V. parahaemolyticus, V. vulnificus, V. cholerae*), *Renibacterium* (including, for example, *R. salmonarum*), *Salmonella*, *Clostridium*, *Streptococcus*, taura syndrome virus, white spot baculovirus, yellowhead virus, norovirus, calicivirus, hepatitis A virus, or infections hypodermal and hematopoietic necrosis virus.

Without wishing to be bound by theory, the matrix fluid compositions saturate and cohere to pathogens and inhibit the pathogen functions. For example, the matrix fluid compositions destroy membrane integrity of the pathogens, thereby preventing or eliminating pathogenic disease. In some embodiments, the soil in which a crop is being cultivated is compromised with a soil-based pathogen.

The agriculture that is treated is not particularly limited, and can be any agriculture having a pathogenic disease. The agriculture could be a crop, aquaculture, or livestock agriculture. In some embodiments, the agriculture exhibits industrial, commercial, recreational, or aesthetic value. In some embodiments, the agriculture is a plant. In some embodiments, the plant is a poinsettia, flowers, lupin, grass, alfalfa, trees, or ivy. In some embodiments the crop is a food producing plant. In some embodiments, the crop is a banana, cacao, coffee, bean, cotton, maize, wheat, rice, corn, potato, tomato, pepper, squash, gourds, cucumber, berry, grape, pome, drupe, citrus, melon, tropical fruit, cotton, nuts, soybean, sorghum, cane, cucurbits, onion, aubergine, parsnip, hemp, herbs, other plant, or pulse. In some embodiments, the livestock is an aquatic livestock, such as fish, mollusks, or crustaceans.

In some embodiments, the methods include applying the matrix fluid composition to the crop or to the soil in which the crop is growing. Applying the matrix fluid composition may be achieved by various means, including, for example, by spraying, drenching, soaking, watering, crop-dusting, misting, high-pressure liquid injection, or otherwise applying the matrix fluid composition to the plants or surrounding soil. In some embodiments, the matrix fluid composition is applied to the plant itself, such as to the leaves, stem, trunk, stalk, flowers, branches, fruits, roots, shoots, buds, rhizome, seeds, or other portions of the plant, or it is applied to the soil in which or around which the plant is being cultivated. In some embodiments, the matrix fluid composition is formulated as a seed coating, and the method includes coating a seed with the composition. In some embodiments, the seed coating is an electrostatic seed coating. In some embodiments, the seed coating includes micronutrients. In some embodiments, the seed coating protects the plant seed from harmful pathogens, such as fungi or bacteria during storage. In some embodiments, the seed coating allows for uniform size of plant seeds for bulk planting techniques. In some embodiments, the seed coating increases germination rates, increases seedling survival, and/or increases crop yields. In some embodiments, the matrix fluid composition is formulated as a powder, and the method includes applying the powder to the plant or to plant parts, such as applied to seeds, leaves, stem, trunk, stalk, flowers, branches, fruits, roots, shoots, buds, rhizome, or other portions of the plant, or to the soil in which or around which the plant is being cultivated. In some embodiments, the matrix fluid composition is formulated together with a fertilizer or nutrient, and the method includes applying the fertilizer or nutrient to the plant. Such fertilizers or nutrients may include, for example, nitrogen, phosphorus, potassium, sulfur, magnesium and/or calcium. In some embodiments, the pathogen becomes ineffective directly upon contact with the matrix fluid compositions described herein.

In some embodiments the methods including applying the composition to aquatic life or to livestock. In some embodiments, the methods include topically applying the composition to aquatic life or livestock, such as by applying a spray, mist, solution, salve, or concentrated formulation. In some embodiments, the compositions are applied to livestock waste ponds or lakes, such as to feces run-off ponds or lakes. In some embodiments, the methods include feeding the composition to aquatic life or livestock, such as by distributing the composition in water or feed of the aquatic life or livestock, or in the aquatic life or livestock environment. In some embodiments, the methods include depositing the composition in water in which aquatic livestock are being cultivated, or distributing the composition to plants that field livestock ingest. In some embodiments, the aquatic life includes fish, crustaceans, or mollusks, such as fish, shrimp, or oysters.

EXAMPLES

Example 1—Manufacturing the Matrix Fluid Composition

The following example demonstrates an exemplary method for making an exemplary matrix fluid composition for use in mitigating or controlling a plant or aquaculture pathogen.

An ionic metal, such as a metal nitrate of silver, zinc, gold, or other metal is solubilized in a solution of water to a concentration of 100 mM to generate metal nanoparticles. Tannic acid and tri-sodium citrate are mixed in a large container with rapid mixing. The temperature range can be at a temperature ranging from about 25° C. to about 95° C. The quantities and ratio of tannic acid and tri-sodium citrate are altered depending on the desired size and uniformity of metal nanoparticles. In one example, tannic acid may be used in an amount of 5 mM to 30 mM and tri-sodium citrate may be used in an amount of 30 to 300 nM. The metal solution is added to the mixture of tannic acid and tri-sodium citrate solution over a defined period of time by slowly dripping or injecting the metal solution into the mixture at a specific temperature. The solution is stirred to form metal nanoparticles. In some instances, pre-synthesized metal nanoparticles were obtained. Additional components may be added, such as sodium citrate or emulsifiers. Different concentrations of sodium citrate may be used to finely tune nanoparticle size and/or aggregation state. The metal nanoparticles have a diameter ranging from 1 nm to 500 nm. The composition is added to an activation chamber, wherein the composition is sonicated at 20 kHz for 20 minutes, thereby activating the composition to generate a monodisperse matrix fluid. The sonication disrupts the quantum mechanics field of the composition, and results in formation of a matrix fluid composition. The matrix fluid composition is adjusted such that the final concentration of metal nanoparticles in the composition is in an amount of 1% or less of the amount of citrate in the composition.

Example 2—Additional Methods of Making the Matrix Fluid Compositions

The following example demonstrates an additional method for making an exemplary matrix fluid composition for use in mitigating or controlling a plant, aquaculture, or livestock pathogen.

Silver nitrate salt was mixed with purified water to a final concentration of 0.1 M to generate silver nanoparticles. The solution was stirred until completely solubilized. A dilution of ionic metal was prepared to yield metal ions of 1 mM to 100 mM following addition or organic acids. Tannic acid was added to the ionic metal solution in a final concentration of 30 mM, and allowed to mix for a period of time. After mixing, trisodium citrate was added to the metal nanoparticle to a final concentration of 30 to 300 mM. The addition of tannic acid and trisodium citrate results in formation of metal nanoparticles having a diameter ranging from about 1 nm to about 10 nm. The diameter of the nanoparticles is tightly controlled by adjusting the concentrations of tannic acid or tri-sodium citrate, by adjusting the mixing temperature, or by adjusting the reaction temperature. After nanoparticle formulation, the solution of silver nanoparticles was mixed by stirring or sonication. In some instances, pre-synthesized silver nanoparticles were obtained. Citric acid was then added to the solution to yield the desired concentration. The solution was centrifuged at a force ranging from 1000×g to 100,000×g.

Example 3—Treating Plant Pathogens

The following example demonstrates an exemplary method for treating a plant pathogen using the matrix fluid composition prepared in Example 1 or Example 2.

The matrix fluid composition of Example 1 or Example 2 is applied to plants to treat a type of *Fusarium* wilt, caused by the fungal pathogen *Fusarium oxysporum* f. sp. *Cubense*, a soil-borne disease. The matrix fluid composition is applied to the soil as well as to the plants themselves by spraying the plants and/or drenching or by high-pressure injection into the soil of depths from 1 to 36 inches. The composition is deposited to the plants or surrounding soil in an amount sufficient to generally coat the plant or drench the soil, including the regions of the plant affected by the pathogen, or in the soil sufficient for treatment of the roots and for root uptake. The matrix fluid composition is sprayed on the plants on day 1. A control group is tested by applying a non-activated composition that does not include the matrix fluid to the plants on day 1. The plants are observed daily for a period of 30 days. After 30 days, the plants that are sprayed with the matrix fluid composition of Example 1 exhibit complete restoration of plant health, as determined by visual inspection of the plants. Plants that receive the matrix fluid composition of Example 1 also exhibit increased yield in fruit production. Plants that did not receive the matrix fluid composition of Example 1 exhibit increased pathogenic disease as determined by visual inspection of the plants.

Example 4—Treating Banana Plants

The following example demonstrates an exemplary method for treating banana plants having black sigatoka (*Mycosphaerella fijiensis*) using the matrix fluid composition prepared in Example 1 or Example 2.

Figure 2A:
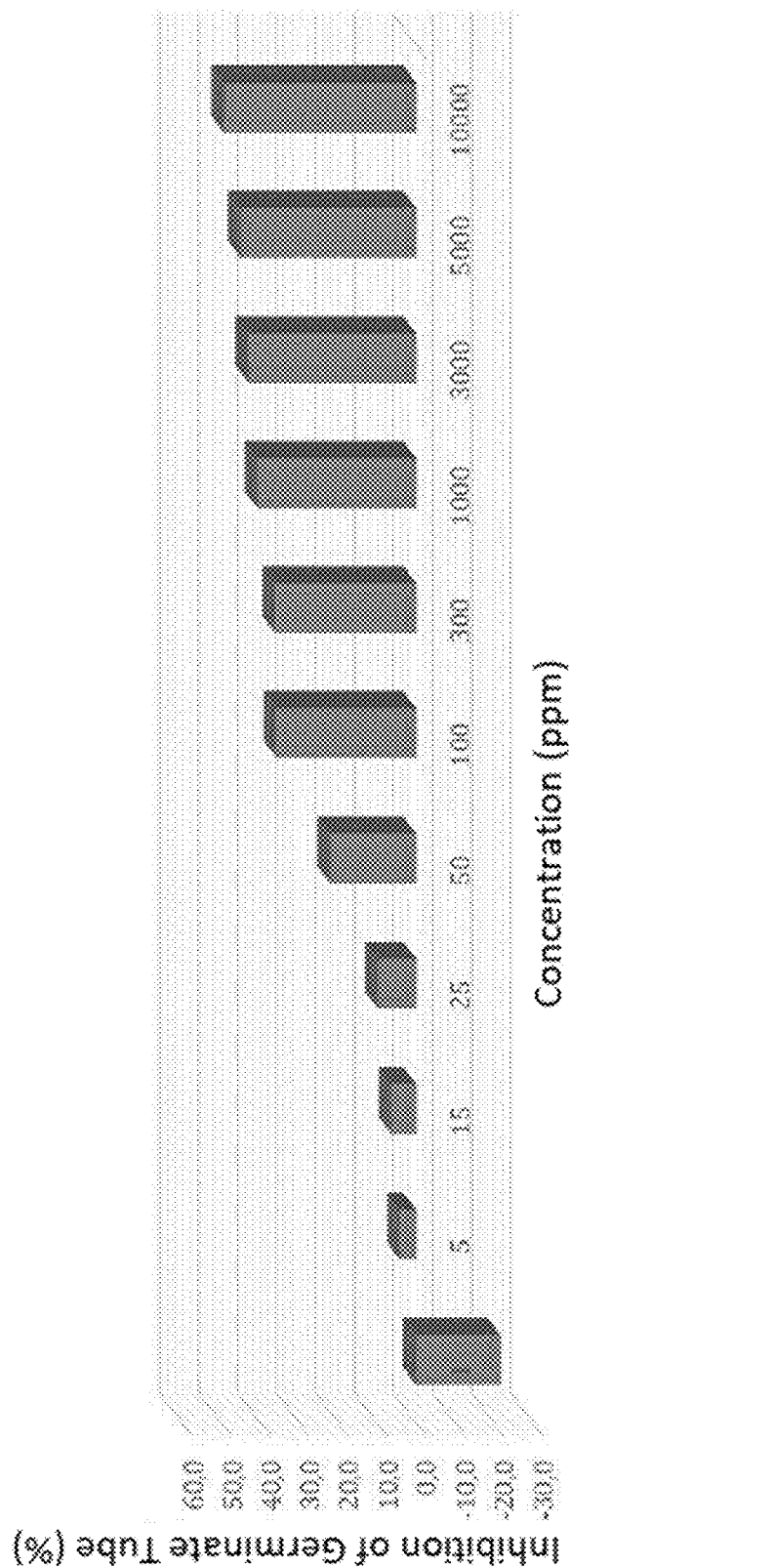
FIGS. 2A-2C show exemplary results of decrease in growth of the plant pathogen *Mycosphaerella fijiensis* when treated with the compositions described herein.
Figure 2B:
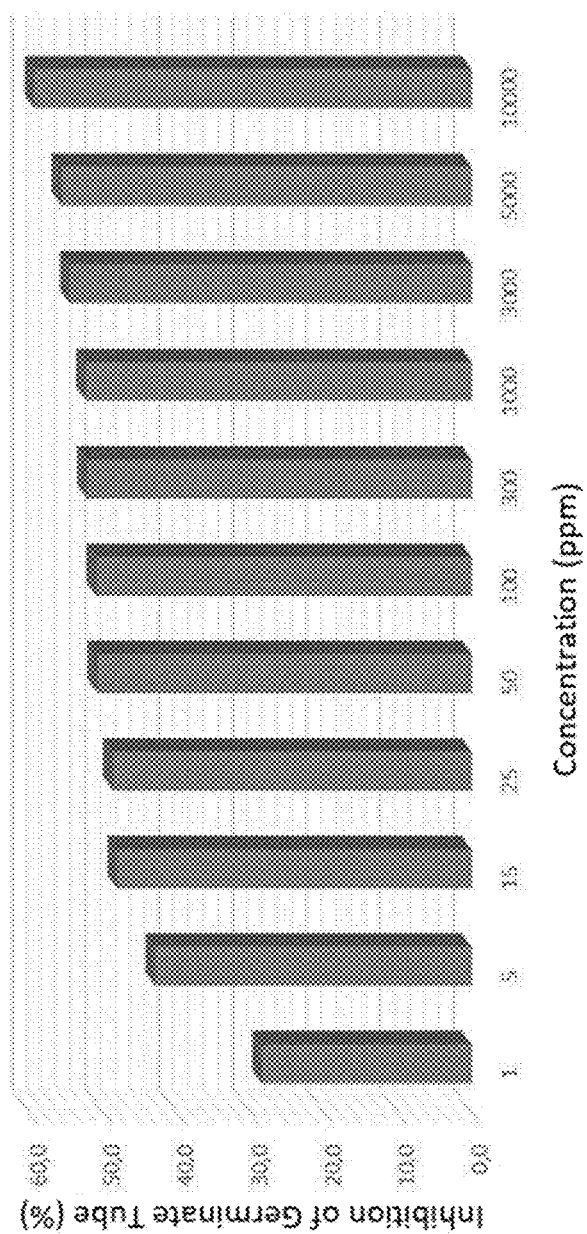
Figure 2C:
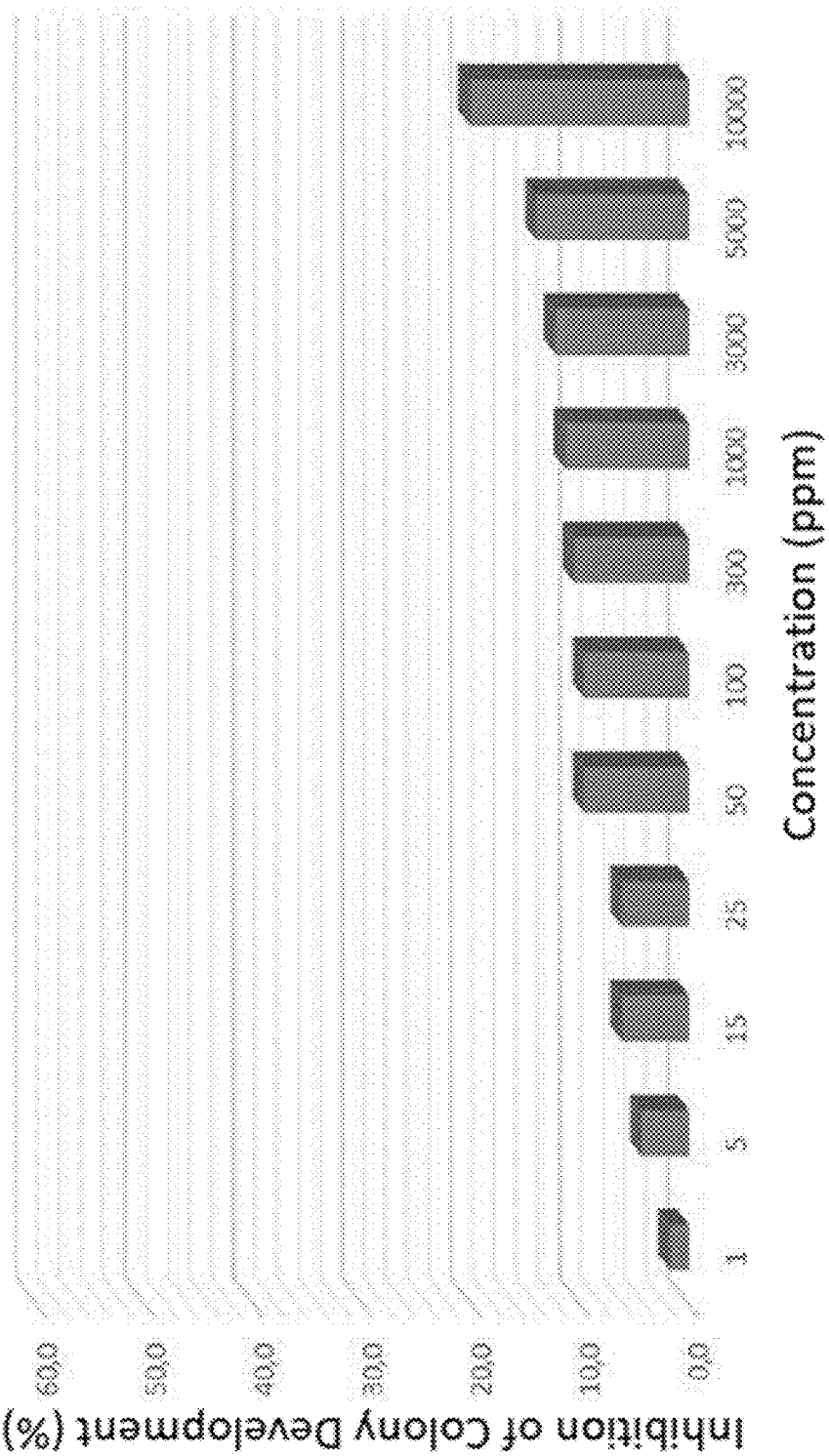
Figure 3:
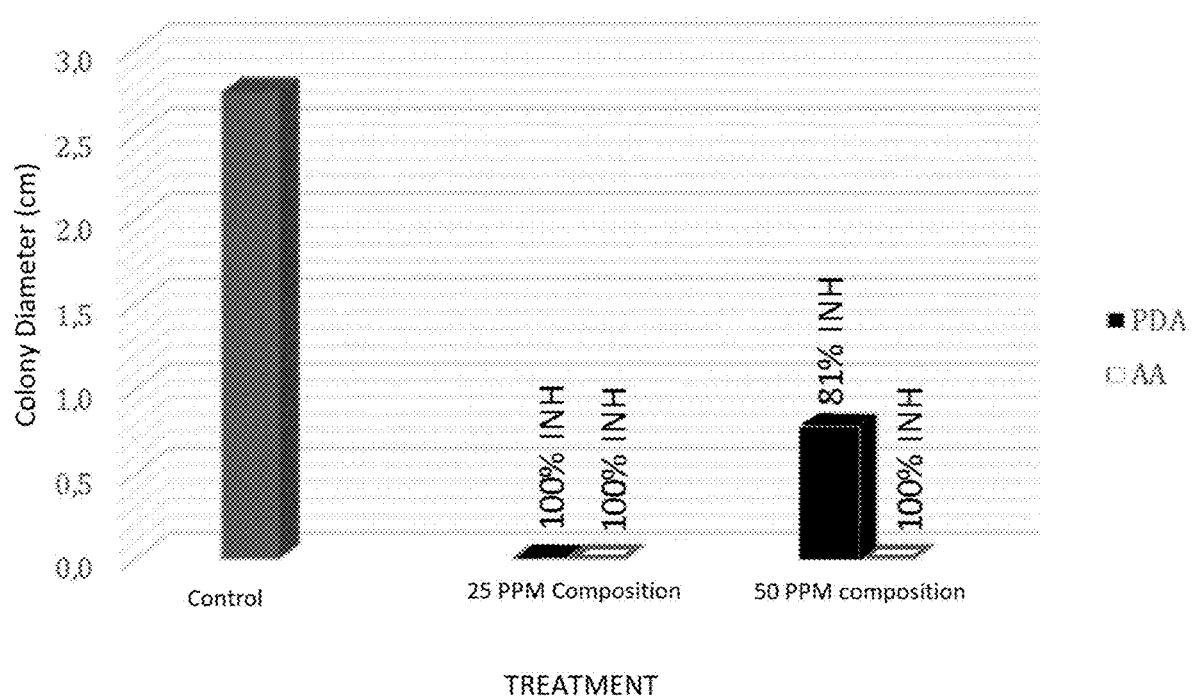
FIG. 3 depicts exemplary results of decreased growth of *M. fijiensis* in rich media (PDA) and poor media (AA) treated with the compositions described herein, as measured by colony diameter size, as compared to a control treatment lacking the compositions described herein.

The matrix fluid composition of Example 1 was applied to banana plants to treat black sigatoka, caused by the ascomycete fungal pathogen *Mycosphaerella fijiensis*. The matrix fluid composition was applied to the soil as well as to the plants themselves by spraying the plants and surrounding soil with the composition in an amount sufficient to generally coat the plant, including the regions of the plant affected by the pathogen. The matrix fluid composition was sprayed on the plants on day 1 in varying concentrations (ranging from 10 ppm to 100 ppm). As shown in FIGS. 2A-2C, the composition inhibited germinate tube growth in both conventional populations (FIG. 2A) and wild-type populations (FIG. 2B) of *M. fijiensis*. Conventional populations showed signs of mutation, whereas wild-type populations did not. In addition, the composition inhibited *M. fijiensis* colony development (FIG. 2C). The *M. fijiensis* structures, including the ascospores and colonies, exhibited decreased growth and development with increased concentration of the composition. In addition, *M. fijiensis* was plated on agar plates having rich medium (potato dextrose agar; PDA) and poor medium (antibiotic agar; AA). The plates were treated with a control composition, a 25 ppm matrix fluid composition, and a 50 ppm matrix fluid composition. As shown in FIG. 3, the colony grew in the medium subjected to the control, as measured by colony diameter. Using the 25 ppm matrix fluid composition, the colony was completely inhibited (100% inhibition) in both the poor medium and the rich medium. Using 50 ppm matrix fluid composition, the colony was completely inhibited in the poor medium, and significantly inhibited in the rich medium (81% inhibition).

In addition to inhibiting germinate tube growth and inhibiting colony development as described, the plants also exhibited drastic improvement in appearance, such that the wilted and destructive appearance of the disease was no longer visible upon visual inspection after a period of only 72 hours after treatment. The plants also exhibited increased banana yields.

Additional variations than those described herein will be apparent from this disclosure. For example, depending on the embodiment, certain acts, events, or functions of any of the compositions, systems, or methods described herein can be performed in a different sequence, can be added, merged, or left out altogether (e.g., not all described acts or events are necessary for the practice of the algorithms). Moreover, in certain embodiments, acts or events can be performed concurrently. In addition, different tasks or processes can be performed by different machines and/or computing systems that can function together.

The foregoing description and examples has been set forth merely to illustrate the disclosure and are not intended as being limiting. Each of the disclosed aspects and embodiments of the present disclosure may be considered individually or in combination with other aspects, embodiments, and variations of the disclosure. In addition, unless otherwise specified, none of the steps of the methods of the present disclosure are confined to any particular order of performance. Modifications of the disclosed embodiments incorporating the spirit and substance of the disclosure may occur to persons skilled in the art and such modifications are within the scope of the present disclosure. Furthermore, all references cited herein are incorporated by reference in their entirety.

Terms of orientation used herein, such as "top," "bottom," "horizontal," "vertical," "longitudinal," "lateral," and "end" are used in the context of the illustrated embodiment. However, the present disclosure should not be limited to the illustrated orientation. Indeed, other orientations are possible and are within the scope of this disclosure. Terms relating to circular shapes as used herein, such as diameter or radius, should be understood not to require perfect circular structures, but rather should be applied to any suitable structure with a cross-sectional region that can be measured from side-to-side. Terms relating to shapes generally, such as "circular" or "cylindrical" or "semi-circular" or "semi-cylindrical" or any related or similar terms, are not required to conform strictly to the mathematical definitions of circles or cylinders or other structures, but can encompass structures that are reasonably close approximations.

Conditional language used herein, such as, among others, "can," "might," "may," "e.g.," and the like, unless specifically stated otherwise, or otherwise understood within the context as used, is generally intended to convey that some embodiments include, while other embodiments do not include, certain features, elements, and/or states. Thus, such conditional language is not generally intended to imply that features, elements, blocks, and/or states are in any way required for one or more embodiments or that one or more embodiments necessarily include logic for deciding, with or without author input or prompting, whether these features, elements and/or states are included or are to be performed in any particular embodiment.

By "about" is meant a quantity, level, value, number, frequency, percentage, dimension, size, amount, weight or length that varies by as much as 30, 25, 20, 15, 10, 9, 8, 7, 6, 5, 4, 3, 2 or 1% to a reference quantity, level, value, number, frequency, percentage, dimension, size, amount, weight or length. When a value is preceded by the term about, the component is not intended to be limited strictly to that value, but it is intended to include amounts that vary from the value.

Unless otherwise explicitly stated, articles such as "a" or "an" should generally be interpreted to include one or more described items. Accordingly, phrases such as "a device configured to" are intended to include one or more recited devices. Such one or more recited devices can be collectively configured to carry out the stated recitations. For example, "a processor configured to carry out recitations A, B, and C" can include a first processor configured to carry out recitation A working in conjunction with a second processor configured to carry out recitations B and C.

The terms "comprising," "including," "having," and the like are synonymous and are used inclusively, in an open-ended fashion, and do not exclude additional elements, features, acts, operations, and so forth. Likewise, the terms "some," "certain," and the like are synonymous and are used in an open-ended fashion. Also, the term "or" is used in its inclusive sense (and not in its exclusive sense) so that when used, for example, to connect a list of elements, the term "or" means one, some, or all of the elements in the list.

Overall, the language of the claims is to be interpreted broadly based on the language employed in the claims. The language of the claims is not to be limited to the non-exclusive embodiments and examples that are illustrated and described in this disclosure, or that are discussed during the prosecution of the application.

Although system and methods have been disclosed in the context of certain embodiments and examples, this disclosure extends beyond the specifically disclosed embodiments to other alternative embodiments and/or uses of the embodiments and certain modifications and equivalents thereof. Various features and aspects of the disclosed embodiments can be combined with or substituted for one another in order to form varying compositions, systems, or methods. The scope of this disclosure should not be limited by the particular disclosed embodiments described herein.

Certain features that are described in this disclosure in the context of separate implementations can be implemented in combination in a single implementation. Conversely, various features that are described in the context of a single implementation can be implemented in multiple implementations separately or in any suitable subcombination. Although features may be described herein as acting in certain combinations, one or more features from a claimed combination can, in some cases, be excised from the combination, and the combination may be claimed as any subcombination or variation of any subcombination.

While the methods and devices described herein may be susceptible to various modifications and alternative forms, specific examples thereof have been shown in the drawings and are herein described in detail. It should be understood, however, that the invention is not to be limited to the particular forms or methods disclosed, but, to the contrary, the invention is to cover all modifications, equivalents, and alternatives falling within the spirit and scope of the various embodiments described and the appended claims. Further, the disclosure herein of any particular feature, aspect, method, property, characteristic, quality, attribute, element, or the like in connection with an embodiment can be used in all other embodiments set forth herein. Any methods disclosed herein need not be performed in the order recited. Depending on the embodiment, one or more acts, events, or functions of any of the algorithms, methods, or processes described herein can be performed in a different sequence, can be added, merged, or left out altogether (e.g., not all described acts or events are necessary for the practice of the algorithm). In some embodiments, acts or events can be performed concurrently, e.g., through multi-threaded processing, interrupt processing, or multiple processors or processor cores or on other parallel architectures, rather than sequentially. Further, no element, feature, block, or step, or group of elements, features, blocks, or steps, are necessary or indispensable to each embodiment. Additionally, all possible combinations, sub-combinations, and rearrangements of systems, methods, features, elements, modules, blocks, and so forth are within the scope of this disclosure. The use of sequential, or time-ordered language, such as "then," "next," "after," "subsequently," and the like, unless specifically stated otherwise, or otherwise understood within the context as used, is generally intended to facilitate the flow of the text and is not intended to limit the sequence of operations performed. Thus, some embodiments may be performed using the sequence of operations described herein, while other embodiments may be performed following a different sequence of operations.

Moreover, while operations may be depicted in the drawings or described in the specification in a particular order, such operations need not be performed in the particular order shown or in sequential order, and all operations need not be performed, to achieve the desirable results. Other operations that are not depicted or described can be incorporated in the example methods and processes. For example, one or more additional operations can be performed before, after, simultaneously, or between any of the described operations. Further, the operations may be rearranged or reordered in other implementations. Also, the separation of various system components in the implementations described herein should not be understood as requiring such separation in all implementations, and it should be understood that the described components and systems can generally be integrated together in a single product or packaged into multiple products. Additionally, other implementations are within the scope of this disclosure.

Some embodiments have been described in connection with the accompanying figures. Certain figures are drawn and/or shown to scale, but such scale should not be limiting, since dimensions and proportions other than what are shown are contemplated and are within the scope of the embodiments disclosed herein. Distances, angles, etc., are merely illustrative and do not necessarily bear an exact relationship to actual dimensions and layout of the devices illustrated. Components can be added, removed, and/or rearranged. Further, the disclosure herein of any particular feature, aspect, method, property, characteristic, quality, attribute, element, or the like in connection with various embodiments set forth herein. Additionally, any methods described herein may be practiced using any device suitable for performing the recited steps.

The methods disclosed herein may include certain actions taken by a practitioner; however, the methods can also include any third-party instruction of those actions, either expressly or by implication.

In summary, various embodiments and examples of compositions, systems, and methods for treating agricultural pathogens have been disclosed. Although the compositions, systems, and methods have been disclosed in the context of those embodiments and examples, this disclosure extends beyond the specifically disclosed embodiments to other alternative embodiments and/or other uses of the embodiments, as well as to certain modifications and equivalents thereof. This disclosure expressly contemplates that various features and aspects of the disclosed embodiments can be combined with, or substituted for, one another. Thus, the scope of this disclosure should not be limited by the particular disclosed embodiments described herein, but should be determined only by a fair reading of the claims that follow.

The ranges disclosed herein also encompass any and all overlap, sub-ranges, and combinations thereof. Language such as "up to," "at least," "greater than," "less than," "between," and the like includes the number recited. Numbers preceded by a term such as "about" or "approximately" include the recited numbers and should be interpreted based on the circumstances (e.g., as accurate as reasonably possible under the circumstances, for example ±5%, ±10%, ±15%, etc.). For example, "about 1 V" includes "1 V." Phrases preceded by a term such as "substantially" include the recited phrase and should be interpreted based on the circumstances (e.g., as much as reasonably possible under the circumstances). For example, "substantially perpendicular" includes "perpendicular." Unless stated otherwise, all measurements are at standard conditions including temperature and pressure.

What is claimed is:

1. An activated composition for treating a plant pathogen, the composition comprising:
   one or more metal nanoparticles, wherein the one or more metal nanoparticles are silver nanoparticles present in an amount of about 25 ppm to about 20,000 ppm, having a diameter ranging from about 1 nm to about 20 nm; and
   one or more organic acids, wherein the one or more organic acids comprise tannic acid present in an amount of about 5 mM to about 30 mM, and citric acid or tri-sodium citrate present in an amount of about 1% w/v to about 40% w/v.

2. The composition of claim 1, wherein the metal nanoparticles are present in an amount of less than 1% of the amount of the one or more organic acids.

3. The composition of claim 1, wherein the metal nanoparticles are monodispersed via sonication, emulsification, surfactant, or similar suspension techniques.

4. The composition of claim 1, wherein the composition is activated by excitation with sonication, a laser, an electron gun, or thermal excitation.

5. The composition of claim 1, wherein the composition is formulated as a spray, a fluid matrix, a mist, a seed coating, or powder.

6. The composition of claim 1, wherein the activated composition has increased viscosity compared to a non-activated composition.

7. The composition of claim 1, wherein the activated composition remains stable for a period of at least 2 years.

8. A method of making an activated composition, the method comprising:

generating metal nanoparticles;

mixing the metal nanoparticles with one or more organic acids, wherein the metal nanoparticles are present in an amount of about 30 ppm to 20,000 ppm, and wherein the metal nanoparticles have a diameter ranging from about 1 nm to about 20 nm, and wherein the one or more organic acids comprise tannic acid present in an amount of about 5 mM to about 30 mM, and citric acid or tri-sodium citrate present in an amount of about 1% w/v to about 40% w/v; and activating the composition via chemical reduction or excitation of the composition with energy using an energy source.

9. The method of claim 8, wherein the energy source is sonication, a laser, an electron gun, or thermal excitation.

10. The method of claim 8, wherein activating the composition comprises modulating the ionic, electronic, or quantum mechanics properties of the composition.

11. The method of claim 8, wherein activating the composition comprises increasing electron ion activity in the composition, increases nanoparticle density, increases phonons, or increases a quantity of particle ions.

12. A kit, comprising:

a composition comprising:

one or more metal nanoparticles, wherein the one or more metal nanoparticles are silver nanoparticles present in an amount of about 25 ppm to about 20,000 ppm, having a diameter ranging from about 1 nm to about 20 nm; and one or more organic acids, wherein the one or more organic acids comprise tannic acid present in an amount of about 5 mM to about 30 mM, and citric acid or tri-sodium citrate present in an amount of about 1% w/v to about 40% w/v; and a dispensing apparatus capable of applying the composition to a plant.

13. The kit of claim 12, wherein the dispensing apparatus is a spray bottle, a sprayer, a nozzle, or a drip line.

14. The kit of claim 12, wherein the kit is a ready-to-use kit.

15. The kit of claim 12, wherein the composition is a concentrated composition.

16. The composition of claim 1, wherein the plant pathogen is a mold, mold spore, fungus, mutated fungus, fungi spore, bacterium mutated bacterium virus, mutated virus, nematode prior, or mutated prion.

17. The composition of claim 1, wherein the plant pathogen is *Fusarium oxysporum* f. sp. *Cubense* or *Mycosphaerella fijiensis*.

18. The composition of claim 1, wherein the composition further comprises acetic acid, oxalic acid, tartaric acid, succinic acid, maleic acid, fumaric acid, gluconic acid, malic acid, ascorbic acid, benzoic acid, palmitic acid, alginic acid, polyglutamic acid, naphthalenesulfonic acid, methanesulfonic acid, p-toluenesulfonic acid, naphthalenedisulfonic acid, polygalacturonic acid, malonic acid, sulfosalicylic acid, glycolic acid, 2-hydroxy-3-naphthoate, pamoate, salicylic acid, stearic acid, phthalic acid, mandelic acid, or lactic acid, or combinations thereof.

19. The composition of claim 1, further comprising nanoparticles comprising gold, magnesium, zinc, calcium, manganese, copper, palladium, nickel, platinum, titanium, cerium, iron, thallium, molybdenum, or an alloy, oxide, hydroxide, sulfide, nitrate, phosphate, fluoride, chloride or combinations thereof.

* * * * *